United States Patent
Gu et al.

(10) Patent No.: US 12,389,616 B2
(45) Date of Patent: Aug. 12, 2025

(54) TRANSISTORS WITH MULTIPLE SILICIDE LAYERS

(71) Applicant: GlobalFoundries U.S. Inc., Malta, NY (US)

(72) Inventors: Man Gu, Malta, NY (US); Hong Yu, Clifton Park, NY (US); Jianwei Peng, Clifton Park, NY (US); Haiting Wang, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 674 days.

(21) Appl. No.: 17/669,584

(22) Filed: Feb. 11, 2022

(65) Prior Publication Data

US 2023/0261088 A1 Aug. 17, 2023

(51) Int. Cl.
*H10D 30/01* (2025.01)
*H01L 21/285* (2006.01)
*H10D 30/67* (2025.01)

(52) U.S. Cl.
CPC ... *H10D 30/0213* (2025.01); *H01L 21/28518* (2013.01); *H10D 30/6735* (2025.01); *H10D 30/6757* (2025.01)

(58) Field of Classification Search
None
See application file for complete search history.

(56) References Cited

U.S. PATENT DOCUMENTS

| | | | |
|---|---|---|---|
| 8,530,315 B2 | 9/2013 | Cai et al. | |
| 2006/0022280 A1 | 2/2006 | Cabral et al. | |
| 2012/0288982 A1* | 11/2012 | Huang | H01L 21/28518 257/E31.127 |
| 2014/0306290 A1 | 10/2014 | Alptekin et al. | |
| 2015/0132898 A1* | 5/2015 | Cheng | H10D 64/017 438/151 |
| 2015/0162414 A1* | 6/2015 | Boschke | H10D 30/0212 257/411 |

FOREIGN PATENT DOCUMENTS

KR 1020180121314 A 11/2018

OTHER PUBLICATIONS

Korean Intellectual Property Office, Notice of Preliminary Rejection issued in Korean Patent Application No. 10-2022-0185590 on May 20, 2024, 18 pages.
Korean Intellectual Property Office, Notice of Second Preliminary Rejection issued in Korean Patent Application No. 10-2022-0185590 on Feb. 18, 2025, 12 pages.

* cited by examiner

*Primary Examiner* — Brent A. Fairbanks
*Assistant Examiner* — Derek L Nielsen
(74) *Attorney, Agent, or Firm* — Thompson Hine LLP; Francois Pagette

(57) ABSTRACT

Structures for a transistor and methods of forming a structure for a transistor. The structure includes a first dielectric spacer, a second dielectric spacer, and a gate laterally between the first dielectric spacer and the second dielectric spacer. The gate includes a first silicide layer extending from the first dielectric spacer to the second dielectric spacer. The structure further includes a second silicide layer within the first silicide layer, and a contact that is aligned to the second silicide layer.

20 Claims, 5 Drawing Sheets

TRANSISTORS WITH MULTIPLE SILICIDE LAYERS

BACKGROUND

The disclosure relates generally to semiconductor devices and integrated circuit fabrication and, in particular, to structures for a transistor and methods of forming a structure for a transistor.

Complementary-metal-oxide-semiconductor (CMOS) processes may be employed to build a combination of p-type and n-type field-effect transistors that are used as devices to construct, for example, logic cells. Field-effect transistors generally include a source, a drain, a semiconductor body supplying a channel region between the source and drain, and a gate electrode overlapped with the semiconductor body. When a control voltage exceeding a characteristic threshold voltage is applied to the gate electrode, charge carrier flow occurs in the channel region between the source and drain to produce a device output current.

A silicide may be used as a contact material on the source, drain, and gate of a field-effect transistor. The silicide may be formed by a thermally-stimulated reaction between a metal or a metallic alloy thin film and the contacted semiconductor material. In conventional constructions for a field-effect transistor, the same silicide material is formed on the source, drain, and gate.

Improved structures for a transistor and methods of forming a structure for a transistor are needed.

SUMMARY

In an embodiment, a structure for a transistor is provided. The structure includes a first dielectric spacer, a second dielectric spacer, and a gate laterally between the first dielectric spacer and the second dielectric spacer. The gate includes a first silicide layer extending from the first dielectric spacer to the second dielectric spacer. The structure further includes a second silicide layer within the first silicide layer, and a contact that is aligned to the second silicide layer.

In an embodiment, a structure for a transistor is provided. The structure includes a gate, and a raised source/drain region adjacent to the gate. The raised source/drain region comprises a semiconductor material. The structure further includes a silicide layer within the semiconductor material of the raised source/drain region, and a contact that is aligned to the silicide layer.

In an embodiment, a method of forming a structure for a transistor is provided. The method includes forming a gate positioned laterally between a first dielectric spacer and a second dielectric spacer. The gate includes a first silicide layer extending from the first dielectric spacer to the second dielectric spacer. The method further includes forming a second silicide layer within the first silicide layer, and forming a contact that is aligned to the second silicide layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
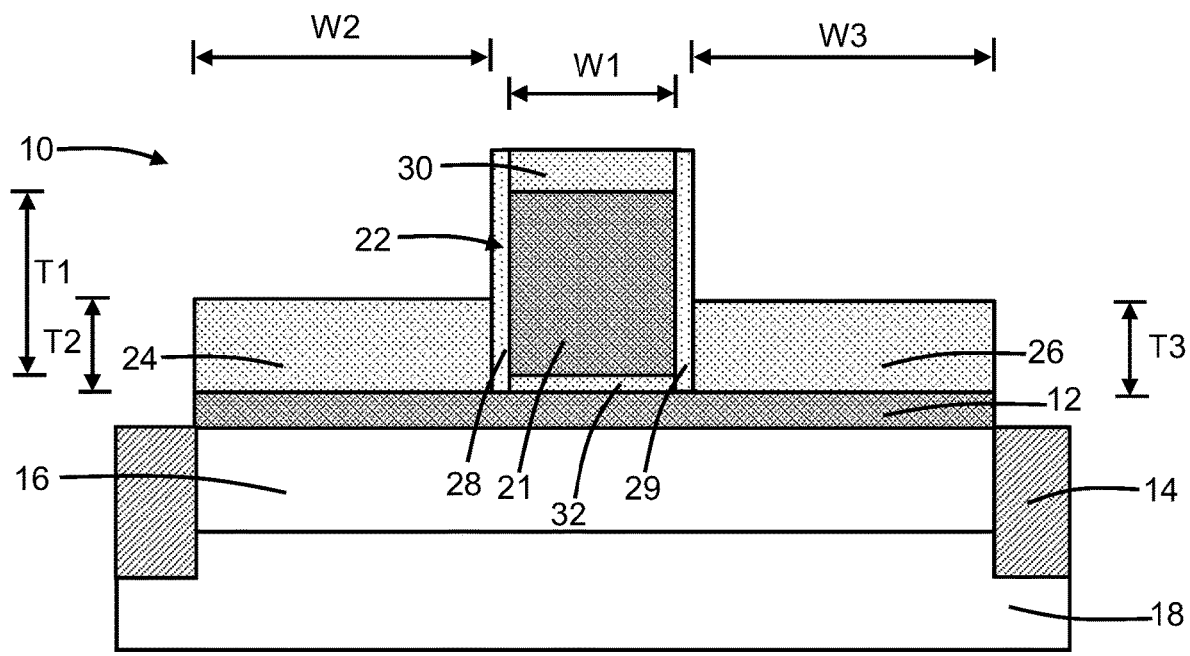
FIGS. 1-8 are cross-sectional views of a structure for a transistor at successive fabrication stages of a fabrication method in accordance with embodiments of the invention.

With reference to FIG. 1 and in accordance with embodiments of the invention, a field-effect transistor 10 may be formed on a semiconductor layer 12. A shallow trench isolation region 14 is formed by patterning a trench extending through the semiconductor layer 12 with lithography and etching processes, depositing a dielectric material to fill the trench, and planarizing and/or recessing the dielectric material. The shallow trench isolation region 14 may extend fully through the semiconductor layer 12 to a dielectric layer 16 and may fully surround a device region in which the field-effect transistor 10 is located. The shallow trench isolation region 14 and the dielectric layer 16 may each contain a dielectric material, such as silicon dioxide, that is an electrical insulator.

In an embodiment, the semiconductor layer 12 may be the device layer of a semiconductor-on-insulator substrate, which further includes a buried dielectric layer providing the dielectric layer 16 and a handle substrate 18. In the representative embodiment, the semiconductor layer 12 may be comprised of a semiconductor material, such as single-crystal silicon. In an embodiment, the semiconductor layer 12 may have a thickness in a range of about 10 nanometers (nm) to about 200 nm.

The field-effect transistor 10 may be formed by front-end-of-line processing as a device in the active region of the semiconductor layer 12. The field-effect transistor 10 may include a gate 22 positioned above the semiconductor layer 12, as well as a raised source/drain region 24 and a raised source/drain region 26 on respective sections of the semiconductor layer 12 adjacent to the gate 22. The gate 22 is positioned in a lateral direction between the raised source/drain region 24 and the raised source/drain region 26. Dielectric spacers 28, 29 separate and electrically insulate the raised source/drain region 24 and the raised source/drain region 26 from the gate 22. The dielectric spacers 28, 29 may be comprised of a dielectric material, such as a low-k dielectric material.

The gate 22 includes a semiconductor layer 21 comprised of a heavily-doped semiconductor material, such as polysilicon, that is deposited on the semiconductor layer 12 and then patterned with lithography and etching processes. The raised source/drain region 24 and the raised source/drain region 26 may be formed by epitaxial growth from respective sections of the semiconductor layer 12 adjacent to the opposite sidewalls of the gate 22. The raised source/drain regions 24, 26 may be epitaxially grown after the gate 22 is formed. The gate 22 has a thickness T1 and a width W1, the raised source/drain region 24 has a thickness T2 and a width W2, and the raised source/drain region 26 has a thickness T3 and a width W3.

The semiconductor material of the raised source/drain regions 24, 26 may be doped (e.g., heavily doped) with a concentration of a dopant, such as an n-type dopant (e.g., phosphorus) that provides n-type conductivity. Alternatively, the semiconductor material of the raised source/drain regions 24, 26 may be doped (e.g., heavily doped) with a concentration of a p-type dopant (e.g., boron) that provides p-type conductivity. Doped regions may be formed in the sections of the semiconductor layer 12 beneath the raised source/drain region 24, 26 by dopant diffusion from the raised source/drain region 24, 26.

As used herein, the term "source/drain region" means a doped region of semiconductor material that can function as either a source or a drain of a field-effect transistor. In an embodiment, the raised source/drain region 24 may be a raised source region of the field-effect transistor 10, and the raised source/drain region 26 may be a raised drain region of the field-effect transistor 10. In an alternative embodiment, the raised source/drain region 24 may be a raised drain region of the field-effect transistor 10, and the raised source/drain region 26 may be a raised source region of the field-effect transistor 10.

A portion of the semiconductor layer 12 positioned beneath the gate 22 and laterally between the raised source/drain region 24 and the raised source/drain region 26 defines a channel region of the field-effect transistor 10. The field-effect transistor 10 may include other elements such as a gate cap 30 comprised of a dielectric material, such as silicon nitride, that is positioned on the semiconductor layer 21 of the gate 22, and a gate dielectric 32 that is positioned between the semiconductor layer 21 and the semiconductor layer 12.

Figure 2:
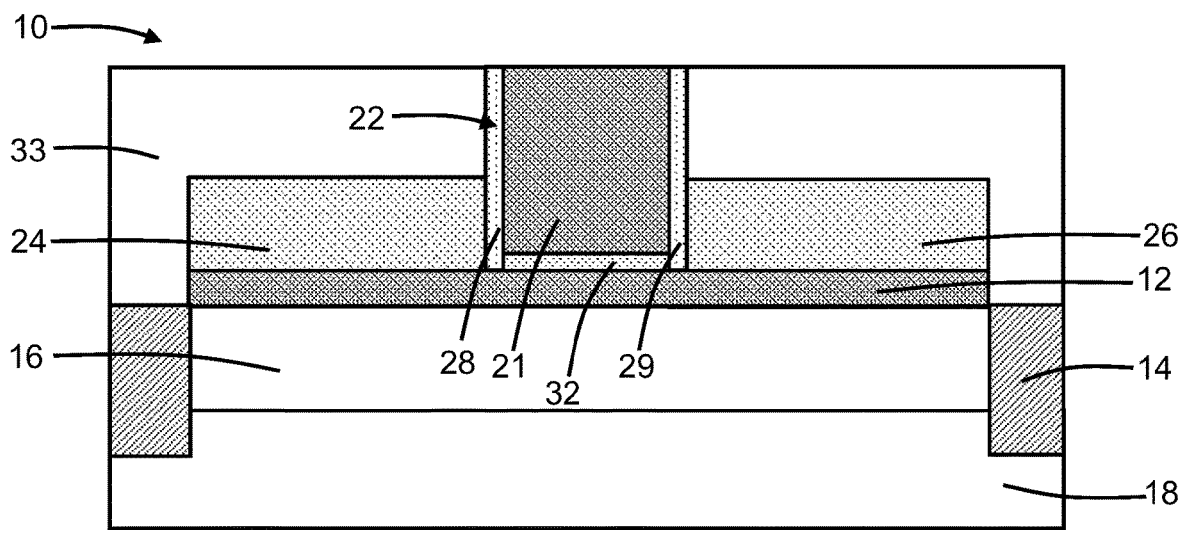

With reference to FIG. 2 in which like reference numerals refer to like features in FIG. 1 and at a subsequent fabrication stage, a dielectric layer 33 is formed over the field-effect transistor 10. The dielectric layer 33 may be comprised of a dielectric material, such as silicon dioxide, that is deposited and planarized by chemical-mechanical polishing to eliminate topography. The gate cap 30, which may function as a polish stop during planarization, may be removed by a selective etching process to expose a top surface of the gate 22. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The dielectric spacers 28, 29 and dielectric layer 33 surround the space over the gate 22 opened by the removal of the gate cap 30.

After removing the gate cap 30, the structure may be planarized by chemical-mechanical polishing to open the semiconductor layer 21 of the gate 22. The top surface of the semiconductor layer 21 may operate as a polish stop during planarization. The planarization also shortens the dielectric spacers 28, 29 and thins the dielectric layer 33.

Figure 3:
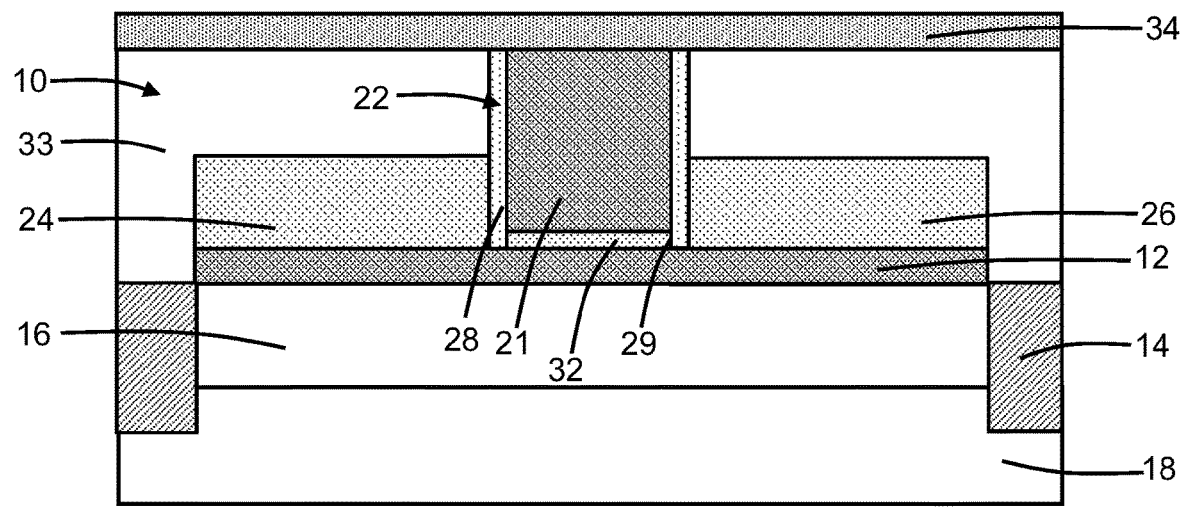

With reference to FIG. 3 in which like reference numerals refer to like features in FIG. 2 and at a subsequent fabrication stage, a layer 34 comprised of a silicide-forming metal is deposited as a coating on the semiconductor layer 21 of the gate 22, the dielectric spacers 28, 29, and the dielectric layer 33. The layer 34 may be in direct contact with the semiconductor layer 21 of the gate 22, and may be subsequently used to silicide the gate 22. In an embodiment, the silicide-forming metal contained in the layer 34 may be nickel included in a deposited coating of nickel-platinum. The layer 34 may be deposited by, for example, physical vapor deposition.

Figure 4:
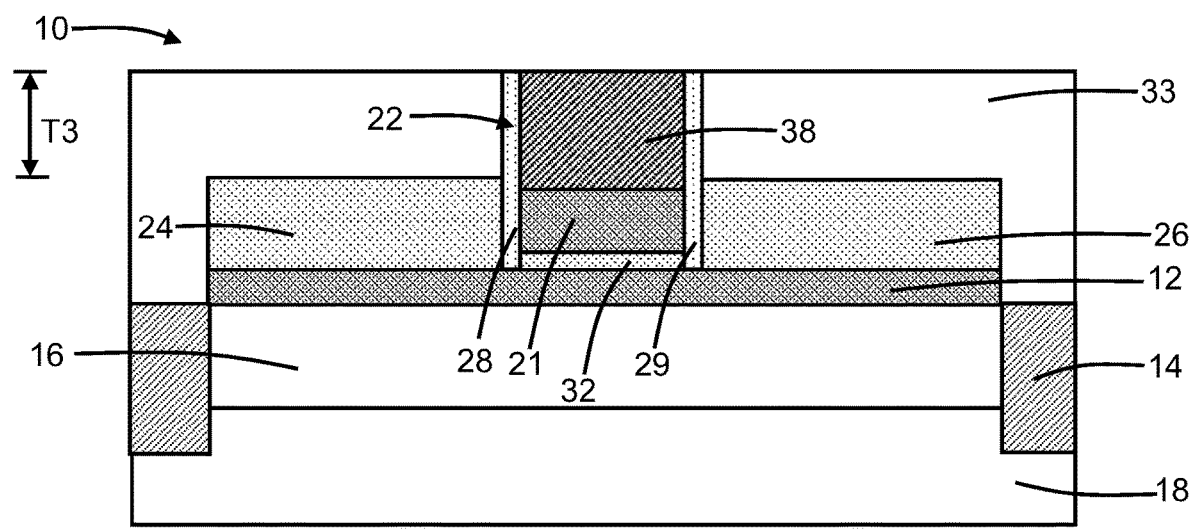

With reference to FIG. 4 in which like reference numerals refer to like features in FIG. 3 and at a subsequent fabrication stage, a silicide layer 38 is formed from the semiconductor layer 21 of the gate 22 and the silicide-forming metal of the layer 34 that is in direct contact with the semiconductor layer 21. The silicide layer 38 may be formed by a silicidation process that involves one or more annealing steps to form a silicide phase by reacting the silicide-forming metal in the deposited layer 34 with the semiconductor layer 21. An initial annealing step of the silicidation process consumes the silicide-forming metal to form the silicide layer 38. Following the initial annealing step, any remaining silicide-forming metal may be removed by wet chemical etching. The silicide layer 38 may then be subjected to an additional annealing step at a higher temperature to form a lower-resistance silicide phase.

In an embodiment, the gate 22 may be partially silicided such that an upper portion of the gate 22 is comprised of the silicide layer 38 and a lower portion of the gate 22 is comprised of the semiconductor layer 21. The silicide layer 38 constituting the upper portion of the gate 22 has a thickness T3 that is less than the thickness T1 of the gate 22. In an embodiment, the silicide layer 38 may be comprised of nickel silicide. The silicide layer 38, which has a width equal to the entire width W1 of the gate 22, spans fully across the gate 22 from the dielectric spacer 28 to the dielectric spacer 29. The dielectric layer 33 blocks contact between the raised source/drain region 24, 26 and the layer 34, and therefore prevents silicidation of the raised source/drain region 24, 26 during the formation of the silicide layer 38.

A semiconductor layer 36 comprised of a semiconductor material, such as silicon, may be formed on the silicide layer 38. The semiconductor layer 36 may be used in a subsequent silicidation process, as subsequently described.

Figure 5:
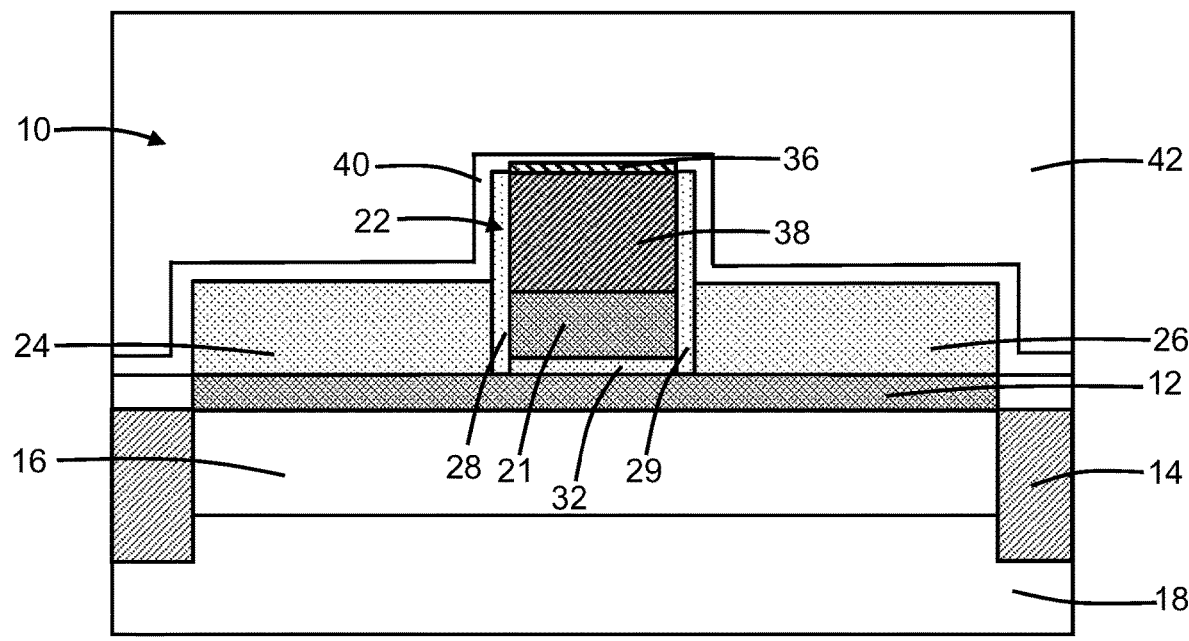

With reference to FIG. 5 in which like reference numerals refer to like features in FIG. 4 and at a subsequent fabrication stage, the dielectric layer 33 may be etched back to reveal the raised source/drain regions 24, 26. A stress liner 40 is applied that coats the field-effect transistor 10. The stress liner 40 may be comprised of a dielectric material, such as silicon nitride, deposited by plasma-enhanced chemical vapor deposition under deposition conditions that cause the dielectric material to be under stress. The deposition conditions may cause the stress liner 40 to incorporate tensile strain, which is transferred as tensile stress to the raised source/drain regions 24, 26. Alternatively, the deposition conditions may cause the stress liner 40 to incorporate compressive strain, which is transferred as compressive stress to the raised source/drain regions 24, 26.

A dielectric layer 42 is formed over the stress liner 40. The dielectric layer 42 may be comprised of a dielectric material, such as silicon dioxide, that is deposited and planarized by chemical-mechanical polishing to eliminate topography.

Figure 6:
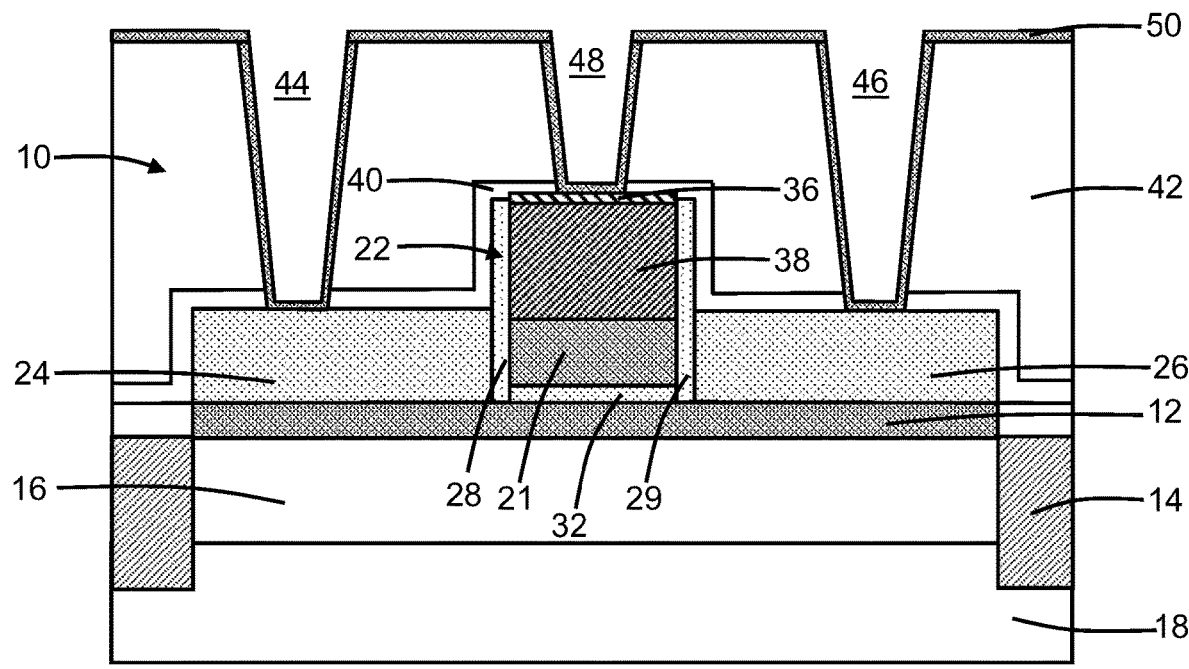

With reference to FIG. 6 in which like reference numerals refer to like features in FIG. 5 and at a subsequent fabrication stage, contact openings 44, 46, 48 are patterned in the dielectric layer 42 and the stress liner 40. The contact opening 44 penetrates through the dielectric layer 42 and the stress liner 40 to a portion of the raised source/drain region 24. The contact opening 46 penetrates through the dielectric layer 42 and the stress liner 40 to a portion of the raised source/drain region 26. The contact opening 48 penetrates through the dielectric layer 42 and the stress liner 40 to a portion of the semiconductor layer 36 positioned on the silicide layer 38 of the gate 22.

A layer 50 comprised of a silicide-forming metal is deposited inside the contact openings 44, 46, 48. The layer 50 may be in direct contact with the semiconductor material of the raised source/drain region 24 over the area revealed at the bottom of the contact opening 44, the semiconductor material of the raised source/drain region 26 over the area revealed at the bottom of the contact opening 46, and the semiconductor layer 36 on the gate 22 over the area revealed at the bottom of the contact opening 48. In an embodiment, the silicide-forming metal contained in the layer 50 may be titanium. The layer 50 may be deposited by, for example, physical vapor deposition.

Figure 7:
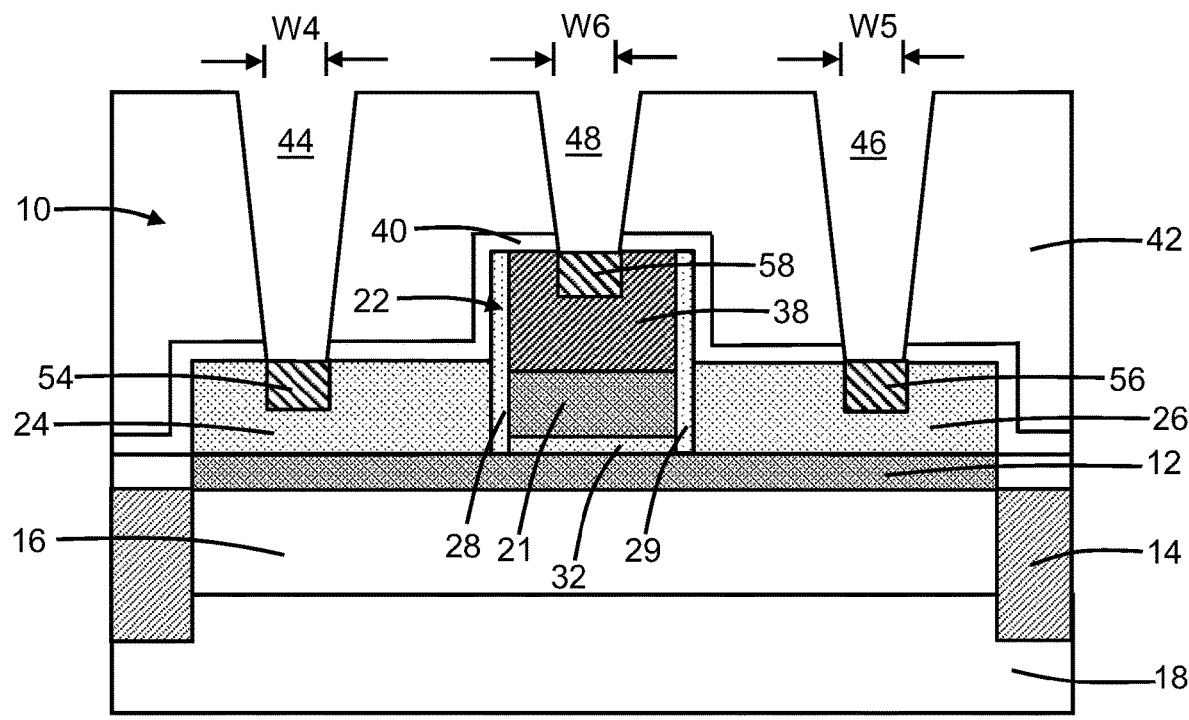

With reference to FIG. 7 in which like reference numerals refer to like features in FIG. 6 and at a subsequent fabrication stage, silicide layers 54, 56, 58 are formed using the silicide-forming metal of the layer 50. The silicide layers 54, 56, 58 may be formed by a silicidation process that involves one or more annealing steps to create a silicide phase by reacting the silicide-forming metal of the deposited layer 50 at the respective bottoms of the contact openings 44, 46, 48 with the semiconductor materials of the raised source/drain region 24, 26 and the semiconductor layer 36 on the gate 22. An initial annealing step of the silicidation process consumes the silicide-forming metal to form the silicide layers 54, 56, 58. Following the initial annealing step, any remaining silicide-forming metal may be removed by wet chemical etching. Portions of the semiconductor layer 36 not consumed by the formation of the silicide layer 58 may be subsumed into the silicide layer 38 on the gate 22. The silicide layers 54, 56, 58 may then be subjected to an additional annealing step at a higher temperature to form a lower-resistance silicide phase.

The silicide layer 54 is embedded within the raised source/drain region 24 and positioned at the bottom of the contact opening 46. The silicide layer 54 may be surrounded by and in direct contact with the semiconductor material of the raised source/drain region 24. The contact opening 44 functions to position the silicide layer 54 relative to the raised source/drain region 24 and to limit the width of the silicide layer 54. In particular, the width W4 of the silicide layer 54 is less than the width W1 of the raised source/drain region 24 such that the raised source/drain region 24 extends laterally beyond the silicide layer 54. The silicide layer 54 extends to a depth within the raised source/drain region 24 that is less than the thickness T2 of the raised source/drain region 24. The silicide layer 54 is embedded in the raised source/drain regions 24 such that the silicide layer 54 is laterally positioned between different portions of the raised source/drain regions 24, and another portion of the raised source/drain regions 24 is positioned in a vertical direction between the silicide layer 54 and the semiconductor layer 12.

The silicide layer 56 is embedded within the raised source/drain region 26 and positioned at the bottom of the contact opening 46. The silicide layer 56 may be surrounded by and in direct contact with the semiconductor material of the raised source/drain region 26. The contact opening 46 functions to position the silicide layer 56 relative to the raised source/drain region 26 and to limit the width of the silicide layer 56. In particular, the width W5 of the silicide layer is less than the width W2 of the raised source/drain region 26 such that the raised source/drain region 26 extends laterally beyond the silicide layer 56. The silicide layer 56 extends to a depth within the raised source/drain region 26 that is less than the thickness T3 of the raised source/drain region 26. The silicide layer 56 is embedded in the raised source/drain region 26 such that the silicide layer 56 is laterally positioned between different portions of the raised source/drain region 26, and another portion of the raised source/drain region 26 is positioned in a vertical direction between the silicide layer 56 and the semiconductor layer 12.

The silicide layer 58 is embedded within the silicide layer 38 of the gate 22 and positioned at the bottom of the contact opening 48. The silicide layer 58 may be surrounded by, and in direct contact with, the silicide layer 38 of the gate 22. The contact opening 48 functions to position the silicide layer 58 relative to the silicide layer 38 and to limit the width of the silicide layer 58. In particular, the width W6 of the silicide layer 58 is less than the width W1 of the silicide layer 38 and the width W1 of the gate 22 such that the silicide layer 38 extends laterally beyond the silicide layer 58. The silicide layer 58 extends to a depth within the silicide layer 38 of the gate 22 that is less than the thickness of the silicide layer 38, which may be a fraction of the thickness T1 of the gate 22. The silicide layer 58 is embedded in the silicide layer 38 such that the silicide layer 58 is laterally positioned between different portions of the silicide layer 38, and another portion of the silicide layer 38 is positioned in a vertical direction between the silicide layer 58 and the semiconductor layer 21.

Figure 8:
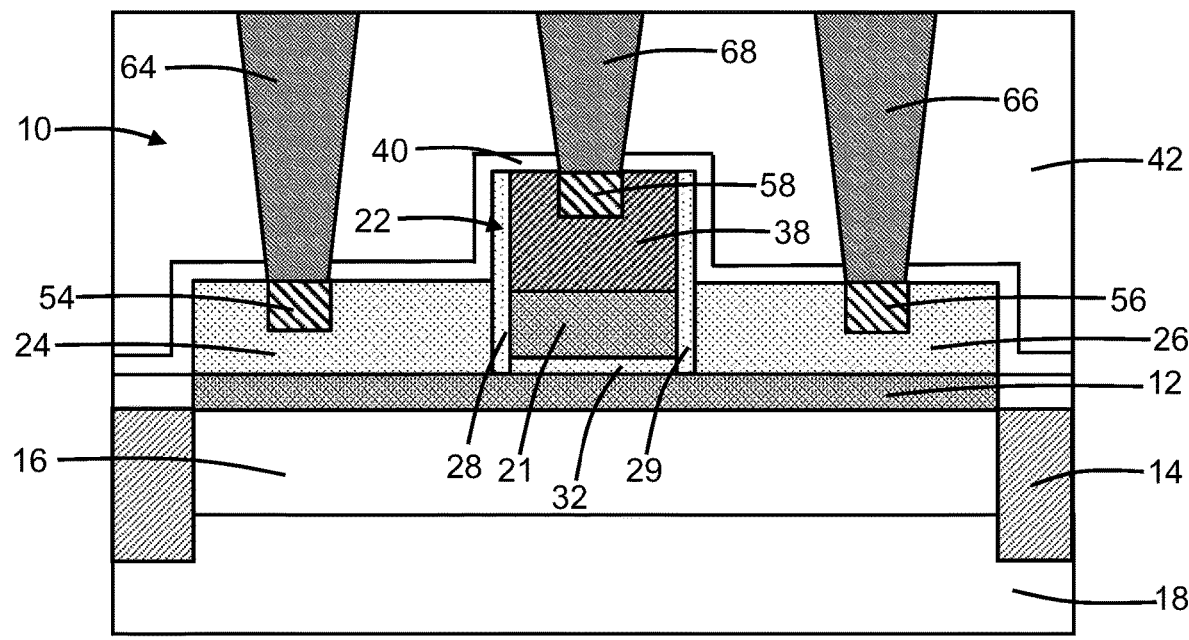

With reference to FIG. 8 in which like reference numerals refer to like features in FIG. 7 and at a subsequent fabrication stage, a contact 64 is formed in the contact opening 44, a contact 66 is formed in the contact opening 46, and a contact 68 is formed in the contact opening 48. In an embodiment, the contacts 64, 66, 68 may be comprised of tungsten that is deposited by chemical vapor deposition and planarized.

The contact 64 is coupled to the raised source/drain region 24 by the silicide layer 54. The contact 64 is in direct contact with the silicide layer 54 along an interface, and the contact 64 is aligned to the silicide layer 54 because both are formed with a width constraint at the interface imposed by the contact opening 44. In an embodiment, the width of the contact 64 at the interface may be equal to the width W4 of the silicide layer 54.

The contact 66 is coupled to the raised source/drain region 26 by the silicide layer 56. The contact 66 is in direct contact with the silicide layer 56 along an interface, and the contact 66 is aligned to the silicide layer 56 because both are formed with a width constraint at the interface imposed by the contact opening 46. In an embodiment, the width of the contact 66 at the interface may be equal to the width W5 of the silicide layer 56.

The contact 68 is coupled to the gate 22 by the silicide layer 58. The contact 68 is in direct contact with the silicide layer 58 along an interface, and the contact 68 is aligned to the silicide layer 58 because both are formed with a width constraint at the interface imposed by the contact opening 48. In an embodiment, the width of the contact 68 at the interface may be equal to the width W6 of the silicide layer 58.

In contrast to conventional transistor constructions, the contacts 64, 66 are aligned to the silicide layers 54, 56 that are physically and electrically in contact with the raised source/drain regions 24, 26 and the contact 68 is aligned to the silicide layer 58 that is physically and electrically in contact with the gate 22. The dual silicide materials of the silicide layer 38 and the silicide layer 58 may be effective to reduce the gate resistance without the formation of the silicide layer 38 having any impact on the raised source/drain regions 24, 26. In that regard, the formation of the silicide layer 38 is independent of the formation of the silicide layers 54, 56, 58. The thickness of the raised source/drain regions 24, 26 may be reduced due to the decoupling provided by the separate formation of the silicide layer 38 of the gate 22 and the silicide layers 54, 56, 58.

Figure 9:
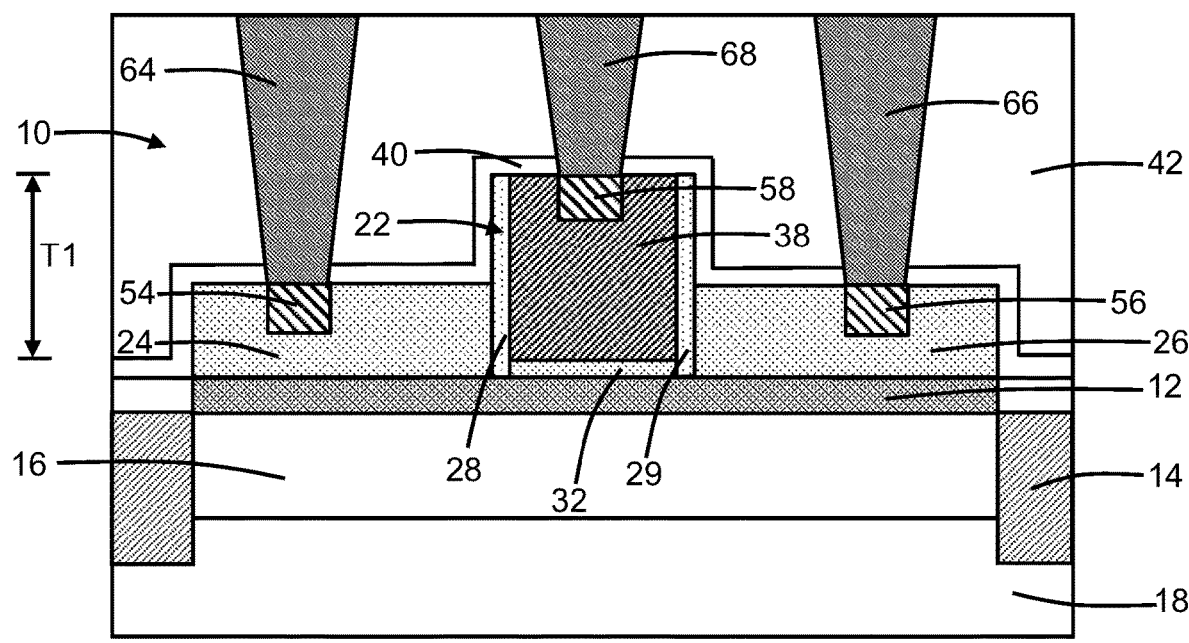
FIG. 9 is a cross-sectional view of a structure for a transistor in accordance with alternative embodiments of the invention

With reference to FIG. 9 in which like reference numerals refer to like features in FIG. 8 and in accordance with alternative embodiments, the gate 22 may be fully silicided such that the constituent semiconductor material is fully consumed during silicidation. As a result, the silicide layer 38 may extend fully in a vertical direction over the entire thickness T1 of the gate 22.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a transistor, the structure comprising:
   a first dielectric spacer;
   a second dielectric spacer;
   a gate laterally between the first dielectric spacer and the second dielectric spacer, the gate including a first silicide layer extending from the first dielectric spacer to the second dielectric spacer;
   a second silicide layer embedded within the first silicide layer, the second silicide layer extending to a depth in the first silicide layer, and the second silicide layer laterally positioned between a first portion of the first silicide layer and a second portion of the first silicide layer; and
   a first contact that is aligned to the second silicide layer.

2. The structure of claim 1 wherein the first contact directly contacts the second silicide layer at an interface, the first contact has a first width at the interface, the second silicide layer has a second width at the interface, and the first width is equal to the second width.

3. The structure of claim 2 wherein the first silicide layer has a third width greater than the second width.

4. The structure of claim 2 wherein the first silicide layer has a first thickness, and the second silicide layer has a second thickness that is less than the first thickness.

5. The structure of claim 1 wherein the gate further includes a semiconductor layer extending from the first dielectric spacer to the second dielectric spacer, and the first silicide layer is stacked with the semiconductor layer.

6. The structure of claim 1 wherein the gate fully comprises the first silicide layer.

7. The structure of claim 1 further comprising:
   a raised source/drain region comprising a semiconductor material, the raised source/drain region positioned adjacent to the gate;
   a third silicide layer within the semiconductor material of the raised source/drain region; and
   a second contact that is aligned to the third silicide layer.

8. The structure of claim 7 wherein the third silicide layer has a first width, and the semiconductor material of the raised source/drain region has a second width that is greater than the first width.

9. The structure of claim 8 wherein the semiconductor material of the raised source/drain region has a first portion and a second portion, and the third silicide layer is laterally positioned between the first portion of the raised source/drain region and the second portion of the raised source/drain region.

10. The structure of claim 1 wherein the first silicide layer comprises a first silicide material, and the second silicide layer comprises a second silicide material having a different composition than the first silicide material.

11. The structure of claim 10 wherein the first silicide material is nickel silicide, and the second silicide material is titanium silicide.

12. The structure of claim 1 further comprising:
   a silicon-on-insulator substrate including a buried dielectric layer and a device layer on the buried dielectric layer,
   wherein the gate is positioned above the device layer.

13. The structure of claim 1 further comprising:
   a stress liner over the gate;
   a dielectric layer on the stress liner; and
   a contact inside a contact opening extending through the stress liner and the dielectric layer,
   wherein the second silicide layer is positioned inside the contact opening between the contact and the first silicide layer.

14. The structure of claim 13 wherein the first portion of the first silicide layer is laterally positioned between the second silicide layer and the first dielectric spacer, the second portion of the first silicide layer is laterally positioned between the second silicide layer and the second dielectric spacer, and the first contact includes a portion laterally positioned between the first portion of the first silicide layer and the second portion of the first silicide layer.

15. The structure of claim 1 wherein the first portion of the first silicide layer is laterally positioned between the second silicide layer and the first dielectric spacer, the second portion of the first silicide layer is laterally positioned between the second silicide layer and the second dielectric spacer, and the first contact includes a portion laterally positioned between the first portion of the first silicide layer and the second portion of the first silicide layer.

16. The structure of claim 1 wherein the first silicide layer has a thickness, and the depth of the second silicide layer is less than the thickness.

17. A method of forming a structure for a transistor, the method comprising:
   forming a gate, wherein the gate is positioned laterally between a first dielectric spacer and a second dielectric spacer, and the gate includes a first silicide layer extending from the first dielectric spacer to the second dielectric spacer;
   forming a second silicide layer embedded within the first silicide layer, wherein the second silicide layer extends to a depth in the first silicide layer, and the second silicide layer is laterally positioned between a first portion of the first silicide layer and a second portion of the first silicide layer; and
   forming a first contact that is aligned to the second silicide layer.

18. The method of claim 17 further comprising:
   forming a raised source/drain region comprising semiconductor material, wherein the raised source/drain region is positioned adjacent to the gate;
   forming a third silicide layer within the semiconductor material of the raised source/drain region; and
   forming a second contact aligned to the third silicide layer.

19. The method of claim 17 wherein the first contact directly contacts the second silicide layer at an interface, the first contact has a first width at the interface, the second silicide layer has a second width at the interface, and the first width is equal to the second width.

20. The method of claim 19 wherein the first silicide layer has a third width greater than the second width, the first silicide layer has a first thickness, and the second silicide layer has a second thickness that is less than the first thickness.

* * * * *